US008728864B2

(12) United States Patent
Ye et al.

(10) Patent No.: US 8,728,864 B2
(45) Date of Patent: *May 20, 2014

(54) METHOD OF FABRICATING A MEMORY CARD USING SIP/SMT HYBRID TECHNOLOGY

(71) Applicant: SanDisk Technologies Inc., Plano, TX (US)

(72) Inventors: Ning Ye, San Jose, CA (US); Robert C. Miller, San Jose, CA (US); Cheemen Yu, Madison, WI (US); Hem Takiar, Fremont, CA (US); Andre McKenzie, Pleasanton, CA (US)

(73) Assignee: SanDisk Technologies Inc., Plano, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 13/685,288

(22) Filed: Nov. 26, 2012

(65) Prior Publication Data

US 2013/0084677 A1 Apr. 4, 2013

Related U.S. Application Data

(63) Continuation of application No. 11/769,942, filed on Jun. 28, 2007, now Pat. No. 8,318,535.

(51) Int. Cl.
*H01L 21/00* (2006.01)

(52) U.S. Cl.
USPC ..... 438/108; 438/106; 438/107; 257/E21.506

(58) Field of Classification Search
USPC ........................... 438/106, 108; 257/E21.506
See application file for complete search history.

(56) References Cited

U.S. PATENT DOCUMENTS

| 6,521,981 | B2 | 2/2003 | Miyazaki et al. |
| 6,793,505 | B2 * | 9/2004 | Dishongh et al. ............... 439/71 |
| 7,772,686 | B2 | 8/2010 | Ye et al. |
| 2005/0122758 | A1 * | 6/2005 | Carlson et al. .................. 365/63 |
| 2006/0030080 | A1 | 2/2006 | Hsueh et al. |
| 2006/0226241 | A1 * | 10/2006 | Hsu .............................. 235/492 |
| 2007/0159802 | A1 | 7/2007 | Wang |
| 2007/0178769 | A1 | 8/2007 | Ni |
| 2008/0001303 | A1 | 1/2008 | Yu et al. |
| 2008/0195817 | A1 | 8/2008 | Hiew et al. |
| 2008/0303166 | A1 | 12/2008 | Liao et al. |
| 2009/0001552 | A1 | 1/2009 | Chiu et al. |
| 2009/0004785 | A1 | 1/2009 | Chiu et al. |

OTHER PUBLICATIONS

Office Action dated Jan. 6, 2009 in U.S. Appl. No. 11/769,954.

(Continued)

*Primary Examiner* — Charles Garber
*Assistant Examiner* — Abdulfattah Mustapha
(74) *Attorney, Agent, or Firm* — Vierra Magen Marcus LLP

(57) ABSTRACT

A portable memory card formed from a multi-die assembly, and methods of fabricating same, are disclosed. One such multi-die assembly includes an LGA SiP semiconductor package and a leadframe-based SMT package both affixed to a PCB. The multi-die assembly thus formed may be encased within a standard lid to form a completed portable memory card, such as a standard SD™ card. Test pads on the LGA SiP package, used for testing operation of the package after it is fabricated, may also be used for physically and electrically coupling the LGA SiP package to the PCB.

6 Claims, 4 Drawing Sheets

(56) References Cited

OTHER PUBLICATIONS

Respoonse to Office Action filed Apr. 6, 2009 in U.S. Appl. No. 11/769,954.
Office Action dated Jul. 17, 2009 in U.S. Appl. No. 11/769,954.
Response to Office Action filed Oct. 19, 2009 in U.S. Appl. No. 11/769,954.
Notice of Allowance dated Jan. 13, 2010 in U.S. Appl. No. 11/769,954.
Notice of Allowance dated Apr. 2, 2010 in U.S. Appl. No. 11/769,954.
Restriction Requirement dated Mar. 23, 2009 in U.S. Appl. No. 11/769,942.
Response to Restriction Requirement dated Apr. 23, 2009 in U.S. Appl. No. 11/769,942.
Office Action dated Jul. 8, 2009 in U.S. Appl. No. 11/769,942.
Response to Office Action dated Oct. 8, 2009 in U.S. Appl. No. 11/769,942.
Office Action dated Jan. 14, 2010 in U.S. Appl. No. 11/769,942.
Response to Office Action dated Apr. 14, 2011 in U.S. Appl. No. 11/769,942.
Final Office Action dated Aug. 3, 2010 in U.S. Appl. No. 11/769,942.
Office Action dated Mar. 4, 2011 in U.S. Appl. No. 11/769,942.
Response to Office Action dated Jul. 5, 2011 in U.S. Appl. No. 11/769,942.
Office Action dated Aug. 3, 2011 in U.S. Appl. No. 11/769,942.
Response to Office Action dated Nov. 3, 2011 in U.S. Appl. No. 11/769,942.
Office Action dated Feb. 6, 2012 in U.S. Appl. No. 11/769,942.
Response to Office Action dated Jul. 6, 2012 in U.S. Appl. No. 11/769,942.
Notice of Allowance and Fee(s) Due dated Jul. 27, 2012 in U.S. Appl. No. 11/769,942.
Restriction Requirement dated Sep. 3, 2008 in U.S. Appl. No. 11/769,954.
Response to Restriction Requirement dated Sep. 25, 2008 in U.S. Appl. No. 11/769,954.

* cited by examiner

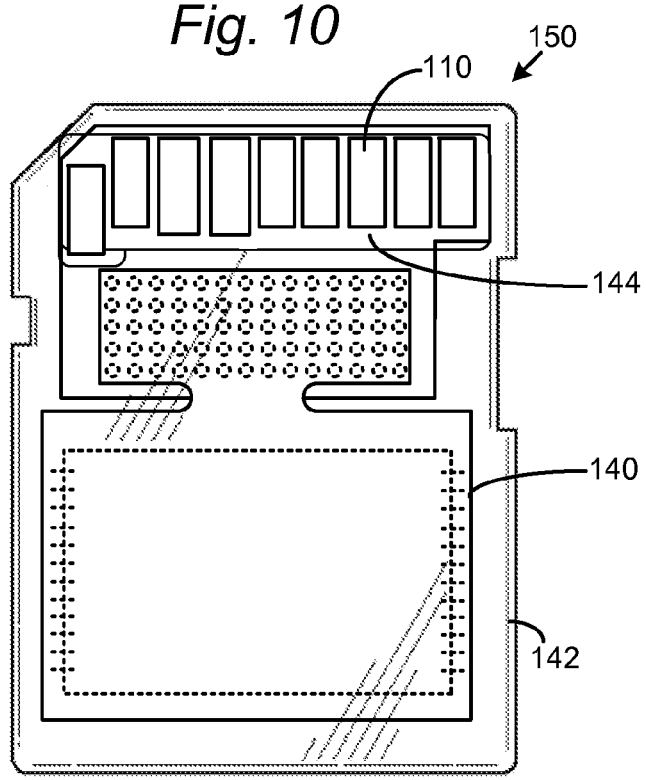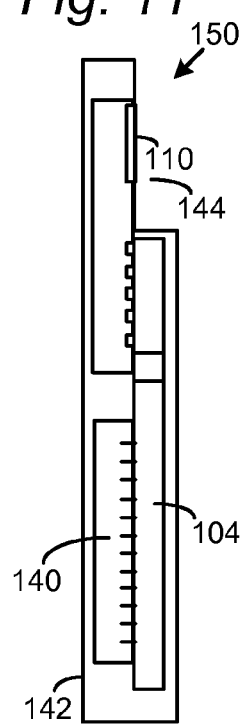

US 8,728,864 B2

METHOD OF FABRICATING A MEMORY CARD USING SIP/SMT HYBRID TECHNOLOGY

CLAIM OF PRIORITY

This application is a continuation of U.S. patent application Ser. No. 11/769,942 filed on Jun. 28, 2007 to be issued as U.S. Pat. No. 8,318,535, entitled METHOD OF FABRICATING A MEMORY CARD USING SIP/SMT HYBRID TECHNOLOGY, which application is incorporated herein by reference in its entirety.

BACKGROUND OF THE INVENTION

1. Field of the Invention

Embodiments of the present invention relate to a method of forming a hybrid portable memory and a portable memory formed thereby.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate. The substrate may in general include a rigid base having a conductive layer etched on one or both sides. Electrical connections are formed between the die and the conductive layer(s), and the conductive layer(s) provide an electric lead structure for integration of the die into an electronic system. Once electrical connections between the die and substrate are made, the assembly is then typically encased in a mold compound to provide a protective package.

Flash memory modules may either be portable, as in the case of a land grid array (LGA) package, or dedicated, as in the case of a ball grid array (BGA) package. Portable flash memory modules are fabricated with contact fingers that allow the modules to be used as removable memory. They may be inserted into a slot in a host device, whereupon the contact fingers are brought into pressure contact with a printed circuit board in the host device to allow communication between the memory module and host device. Dedicated memory modules on the other hand are soldered, or otherwise permanently affixed to the printed circuit board of a host device.

Side and bottom views of a conventional LGA package 40 are shown in FIGS. 1 and 2, respectively. One or more memory die 20 and a controller die 22 are mounted on a substrate 24 in a stacked configuration, along with one or more passive components 26. Generally, the substrate 24 may be formed of a rigid core having thin film copper layer(s) on its top and/or bottom surfaces. An electrical lead pattern may be defined in the copper layer in a desired electrical lead pattern using known photolithography and etching processes. The copper film on the bottom surface may also be used to define a plurality of contact fingers 28 for communication with a host device. A plurality of test pads 30 are also defined in the copper film to allow electrical test and debug of the package. The test pads 30 are typically covered up once the electrical test is completed.

The die may be electrically connected to the substrate by wire bonds 34. Vias (not shown) are formed through the substrate to allow electrical connection of the die through the substrate to the contact fingers 28 and test pads 30. Once the die are electrically connected, the package may be encapsulated in a mold compound 38 (not shown in FIG. 1) to form the package 40. A typical package 40 is shown in a standard size SD lid 44 in prior art FIG. 3. Reduction in the size of the package 40 over time now allows the package 40 to take up only a fraction of the standard SD card lid.

A BGA package is formed in a similar fashion to the LGA package, but instead of contact fingers 28, a plurality of contact pads are formed on the bottom surface of the package. Once the package is fabricated, these contact pads receive solder balls, and the package may be mounted by the solder balls to a printed circuit board within a host device in a known reflow process.

In the above-described packages, the die are themselves packaged and include die bond pads formed in the upper surfaces of the die package. The die packages are electrically coupled to the substrate via wire bonds connected between the die bond pads and the substrate. An alternative mounting scheme includes leads which extend from the die package which are mounted directly to a substrate in a solder operation. Such mounting schemes are typically performed according to surface mount technology (SMT).

Instead of a substrate having a core and copper films, SMT die packages typically use a leadframe, which is a thin layer of metal on which one or more semiconductor die may be mounted. The leadframe includes electrical leads for communicating electrical signals from the one or more semiconductors to a printed circuit board (PCB) to which the leads are soldered. Common leadframe-based packages include plastic small outlined packages (PSOP), thin small outlined packages (TSOP), and shrink small outline packages (SSOP).

FIG. 4 shows a conventional SMT package 50. A leadframe-based memory die 52 and controller die 54 include leads 58 which are soldered to a PCB 56. Passive components 60 are also affixed to the PCB 58. Although not shown, contact fingers are formed on the back surface of PCB 56. Prior art FIG. 5 shows a typical SMT package 50 mounted within a standard size SD lid 44 (as in FIG. 3).

There is an ever-present drive to increase storage capacity within memory modules. One method of increasing storage capacity is to increase the number of memory die used within the package. In portable memory packages, the number of die which may be used is limited by the thickness of the package, which must not exceed a thickness of a standard-sized slot in the host device within which the memory module is received.

SUMMARY OF THE INVENTION

Embodiments of the invention, roughly described, relate to a portable memory card formed from a multi-die assembly, and methods of fabricating same. A first such embodiment includes an LGA SiP semiconductor package and a leadframe-based SMT package both affixed to a PCB. The multi-die assembly thus formed may be encased within a standard lid to form a completed portable memory card. In embodiments, the lid may be a standard SD™ lid. Test pads on the LGA SiP package, used for testing operation of the package after it is fabricated, may also be used for physically and electrically coupling the LGA SiP package to the PCB.

The multi-die assembly for the standard-sized memory card may be comprised of other types of semiconductor die packages in further embodiments. For example, an LGA SiP package and a BGA package may be coupled to a PCB and then encased within a standard lid, such an SD lid, to form a completed portable memory card. The multi-die assembly may also be made up of a first LGA SiP package and a second LGA package, both of which may again be encased within a standard lid, such as an SD lid, to form a completed portable memory card.

DESCRIPTION OF THE DRAWINGS

FIG. 10 is a bottom view of a hybrid multi-die assembly mounted within a standard SD lid according to an embodiment of the present invention.

FIG. 11 is a side view of a hybrid multi-die assembly mounted within a standard SD lid.

DETAILED DESCRIPTION

Embodiments will now be described with reference to FIGS. 6 through 15, which roughly described, relate to a stacked semiconductor package assembly. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 6:
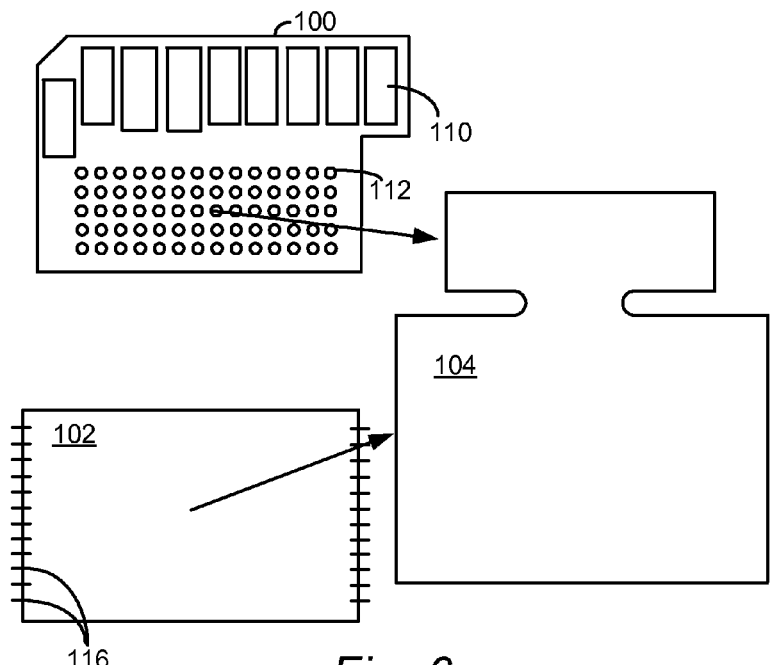
FIG. 6 is an exploded view showing a plurality of semiconductor packages and a printed circuit board according to an embodiment of the present invention.

A first embodiment of the present invention will now be explained with reference to FIGS. 6 through 11. FIG. 6 is an exploded view showing a bottom of a first semiconductor package 100, the bottom of a second semiconductor die package 102 and a top of a substrate 104 to which semiconductor packages 100 and 102 are affixed as explained hereinafter. Semiconductor package 100 may be a standard SiP semiconductor package configured as an LGA package. Further details relating to a SiP package 100 according to an embodiment of the invention are disclosed in United States Patent Application Publication No. 2006/0261454, entitled "System-In-A-Package Based Flash Memory Card" to Takiar, et al., which application is assigned to the owner of the present invention, and which application is incorporated by reference herein in its entirety. In general, SiP package 100 may include a plurality of semiconductor die affixed to a substrate which may for example be a printed circuit board, a lead frame, a tape automated bonding ("TAB") tape or other known substrate on which integrated circuits may be assembled.

The number and type of semiconductor die within SiP package 100 may vary, but in one embodiment, the die may include a flash memory array (e.g., NOR, NAND or other), S-RAM or DDT, and/or a controller chip such as an ASIC. Other semiconductor die are contemplated. The die may be electrically coupled to the substrate by wire bonds, or by solder balls in a flip-chip arrangement. As seen in FIG. 6, a bottom surface of SiP package 100 may include a plurality of contact fingers 110 (one of which is labeled in FIG. 6) for establishing contact with a host device and allowing communication between the host device and a multi-die assembly including SiP package 100, as explained in greater detail hereinafter.

The bottom surface of SiP package 100 may further include a plurality of test pads 112. It is known to form test pads on the back surface of a SiP package for the purpose of testing operation of the SiP package upon completion of fabrication. Once testing is completed, test pads 112 are typically covered for example by sticker or ink jet printing. Further details relating to this function of test pads 112 is disclosed in U.S. patent application Ser. No. 11/679,153 entitled "Method of Making PCB Circuit Modification from Multiple to Individual Chip Enable Signals", to McCarthy, et al., which application is assigned to the owner of the present invention, and which application is incorporated by reference herein in its entirety. As explained in greater detail below, in accordance with embodiments of the present invention, in addition to their traditional test function, test pads 112 are used to physically and electrically couple SiP package 100 to substrate 104.

The semiconductor die and top surface of the substrate in package 100 may be encapsulated in a mold compound to encase and protect the semiconductor die. The bottom surface of the package may include a layer of solder mask on areas not covered by contact fingers 110 or test pads 112.

While a specific configuration of a SiP package 100 is shown, it will be appreciated that any of a variety of LGA SiP package configurations may be mounted to PCB 104 in alternative embodiments.

Semiconductor package 102 in the embodiment of FIG. 6 is mounted to a substrate by surface mount technology. SMT package 102 may comprise one or more semiconductor die mounted on a leadframe. The number of die may vary in alternative embodiments and may for example be a flash memory array (e.g., NOR, NAND or other), S-RAM or DDT, and/or a controller chip such as an ASIC. Other semiconductor die are contemplated. The die may be electrically coupled to the leadframe by wire bonds. Where SiP package 100 includes a controller die, a controller die on SMT package 102 may be unnecessary. However, it is contemplated that a controller die may be included on both packages 100 and 102, one or the other of packages 100 and 102, or on neither of packages 100 or 102.

While a specific configuration of a leadframe-based package 102 is shown, it will be appreciated that any of a variety of leadframe-based package configurations may be mounted to PCB 104 in alternative embodiments. SMT package 102 may for example be a PSOP package, a TSOP, an SSOP, or other type of leadframe based package. Further details relating to such packages are disclosed for example in U.S. patent application Ser. No. 11/354,441, entitled "COL-TSOP With Nonconductive Material for Reducing Package Capacitance," to Lee, et al., which application is assigned to the owner of the present invention, and which application is incorporated by reference herein in its entirety. SMT package 102 may include a plurality of electrical lead pins 116 (some of which are labeled in FIG. 6) for coupling to contact pads of substrate 104 as explained hereinafter.

Substrate 104 may for example be a PCB, but it is contemplated that substrate 104 be a leadframe or TAB tape in alternative embodiments. Where substrate 104 is a PCB, it may include a core having a top and/or bottom conductive metal layer. Although not critical to the present invention, the core may be formed of various dielectric materials such as for example, polyimide laminates, epoxy resins including FR4 and FR5, bismaleimide triazine (BT), and the like. The conductive layers may be formed of copper or copper alloys, plated copper or plated copper alloys, Alloy 42 (42Fe/58Ni), copper plated steel, or other metals and materials known for use on substrates.

The top and bottom metal layers may be etched with a conductance pattern, for example in a known photolithography process, to form a circuit on the PCB 104 for communicating signals between the packages 100 and 102 affixed to the PCB 104 as explained hereinafter. As seen in the bottom view of FIG. 7, such an electrical circuit may include contact pads 122 in a first section 120 of PCB 104, contact pads 126 in a second section 124 of PCB 104, and traces 130 electrically coupled between contact pads 122 and 126. In embodiments, the conductance pattern need only be provided on a single side of PCB 104. However, a conductance pattern may be provided on both surfaces of PCB 104 in alternative embodiments. In such embodiments, vias (not shown) may be provided to transmit electrical signals between the top and bottom surfaces of the PCB 104. After the conductance pattern is formed on one or both surfaces of PCB 104, the PCB may then be inspected in an automatic optical inspection (AOI).

Once patterned and inspected, the top and/or bottom surfaces of PCB 104 may be laminated with a solder mask. One or more gold layers (or other known plating material) may next be formed on the contact pads 122 and 126 to be soldered as explained hereinafter. The one or more gold layers may be applied in a known electroplating process.

Figure 7:
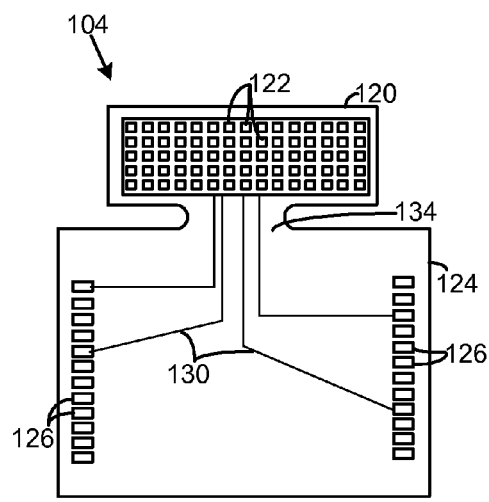
FIG. 7 is a bottom view of a printed circuit board used in the hybrid multi-die assembly of FIGS. 6, 8 and 9.

As indicated above with respect to FIG. 7, PCB 104 includes a first section 120 formed with a plurality of contact pads 122 (some of which are numbered in FIG. 7) which are physically and electrically coupled to test pads 112. PCB 104 further includes a second section 124 including a plurality of contact pads 126 (some of which are labeled in FIG. 7) which are physically and electrically coupled to leads 116 on SMT package 102. In embodiments, first section 120 may have a length and width so as to cover test pads 112. Second section 124 may have a length and width so as to be slightly larger than SMT package 102. PCB 104 further includes electrical traces 130 (some of which are shown and numbered in FIG. 7) defined in the surface of PCB 104 for transferring signals between contact pads 122 in first section 120 and contact pads 126 in second section 124. Contact pads 122, 126 and traces 130 enable the transfer signals and communication between SiP package 100 and SMT package 102 once mounted on PCB 104.

PCB 104 further includes a neck section 134 having a narrower diameter than either first section 120 or second section 124. In embodiments, it may be desirable to allow some degree of flexing of package 100 relative to package 102 once the packages are mounted on PCB 104. Having a narrow diameter neck section 134 allows such flexibility. The diameter of neck section 134 may for example be between 2 mm and 15 mm, and more particularly between 5 mm and 10 mm, in embodiments of the present invention. It is understood that the diameter of the neck section 134 may be less than 2 mm or greater than 15 mm in further embodiments of the present invention.

Figure 8:
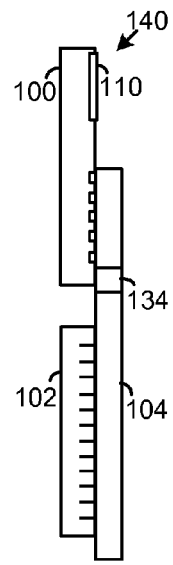
FIG. 8 is a side view of a multi-die hybrid assembly according to an embodiment of the present invention.
Figure 9:
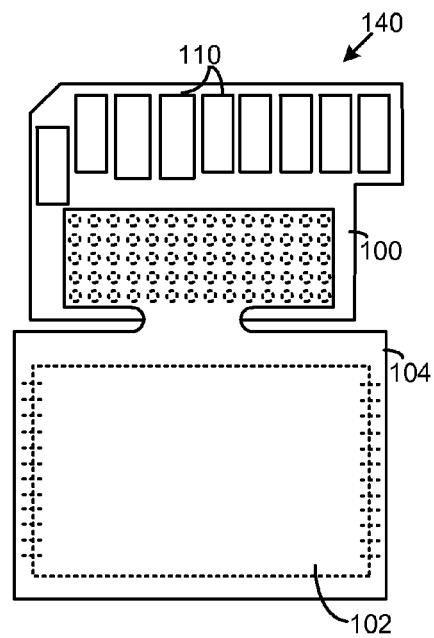
FIG. 9 is a bottom view of a hybrid multi-die assembly according to an embodiment of the present invention.

Referring now to the side view of FIG. 8 and the bottom view of FIG. 9, packages 100 and 102 may be affixed to PCB 104 to form a multi-die assembly 140. As indicated in FIG. 9, a back surface of SiP package 100 is coupled to a front surface of PCB 104 by coupling test pads 112 of package 100 to contact pads 122 of PCB 104. In embodiments, solder balls may be provided at the interface between respective test pads 112 and contact pads 122, which solder balls may be melted and solidified in a known reflow process to permanently affix and electrically couple the test pads 112 to contact pads 122. In embodiments, all test pads 112 may be coupled to contact pads 122. In further embodiments, less than all test pads 112 may be coupled to contact pads 122.

Similarly, a back surface of SMT package 102 is coupled to the front surface of PCB 104 by coupling leads 116 of package 102 to contact pads 126 of PCB 104. Leads 116 may be soldered to contact pads 126 in a known SMT process. In embodiments, all leads 116 may be coupled to contact pads 126. In alternative embodiments, less than all leads 116 may be coupled to contact pads 126. The packages 100 and 102 are coupled via PCB 104 so that the memory on both packages may be accessed by a host device, under the control of a controller in the host, or a controller die in one or both of the packages 100 and 102.

Referring now to the bottom view of FIG. 10 and the side view of FIG. 11, multi-die assembly 140 may be mounted within a standard size lid 142 to form a completed portable memory card 150. In embodiments, lid 142 may be a standard SD™ (Secure Digital) lid as is known in the art having dimensions of 32 mm by 24 mm by 2.1 mm. Lid 142 may also include a window 144 through which contact fingers 110 are exposed to allow the portable memory card 150 to be used in a host device as is known for SD memory cards. In accordance with the present invention, the packages 100 and 102 and printed circuit board 104 fit within the length, width and thickness of a standard SD lid 142.

Figure 1:
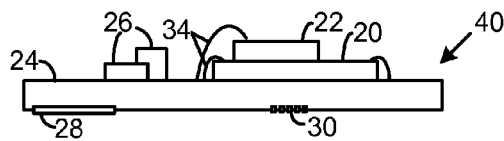
FIG. 1 is a side view of a conventional semiconductor die package without mold compound.
Figure 2:
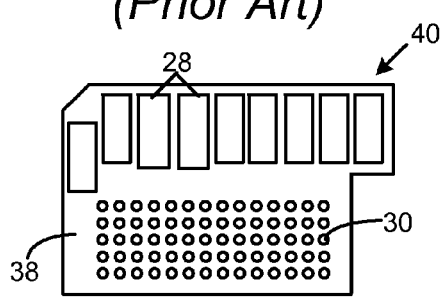
FIG. 2 is a bottom view of a conventional semiconductor die package showing a plurality of contact fingers and test pads.
Figure 3:
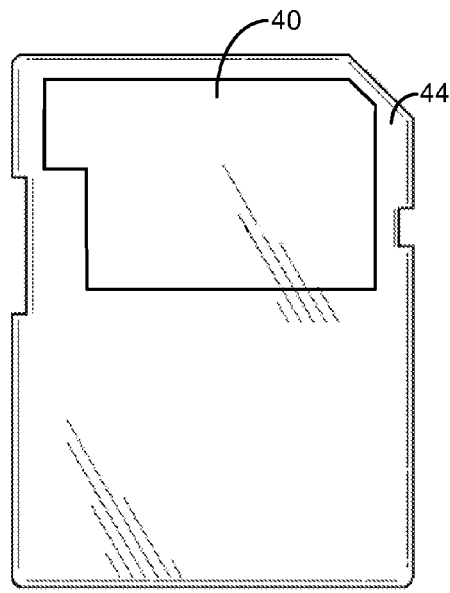
FIG. 3 shows the semiconductor package of FIG. 2 mounted within a standard SD lid.
Figure 4:
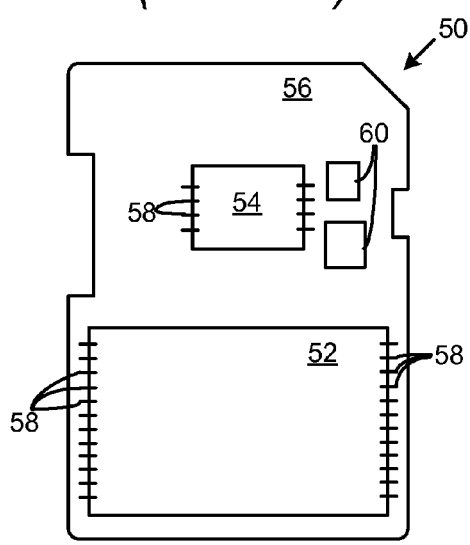
FIG. 4 is a top view of a conventional semiconductor package without mold compound including a pair of semiconductor die mounted to a printed circuit board by surface mount technology.
Figure 5:
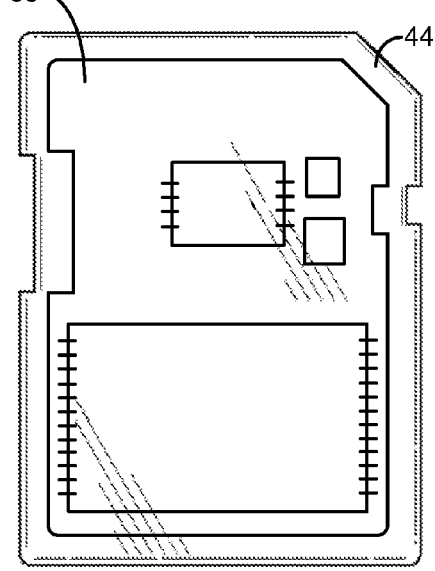
FIG. 5 shows a semiconductor package of prior art FIG. 4 mounted in a standard SD lid.

As discussed in the Background section, prior art SMT SD memory cards, such as shown in FIGS. 4 and 5, included a PCB which extended the full height of the lid and included contact fingers near a top of the card for communicating with a host device. In accordance with the present invention, as seen in FIG. 11, the PCB 104 does not extend the entire height of the lid 142. The PCB 104 ends below the contact fingers 110. The contact fingers are instead provided on the LGA package 100 according to embodiments of the present invention. Thus, the thickness of the assembly within the lid near the top of the card is less than that in prior art SMT SD memory cards. That is, the card is thinner because there is no PCB at the top of the card. Owing to this reduced thickness, there is more room within LGA package 100 for stacking additional memory die, thus allowing an increase in storage capacity beyond what was obtainable in conventional SMT SD memory cards.

Figure 12:
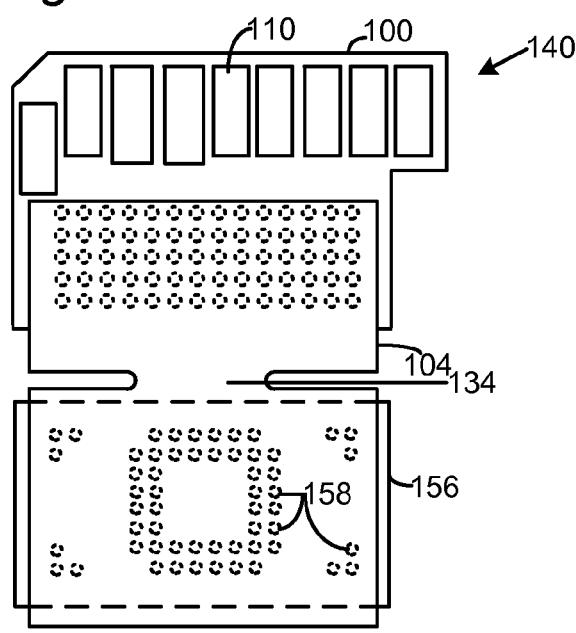
FIG. 12 is a bottom view of a hybrid multi-die assembly according to an alternative embodiment of the present invention.

It is understood that a multi-die assembly 140 may be formed including semiconductor packages other than the semiconductor packages shown in FIGS. 6-11. For example, FIG. 12 shows a SiP package 100 affixed to a PCB 104 as described above, and further including a BGA package 156 affixed to PCB 104. BGA package 156 may include one or more semiconductor die mounted on a substrate, such as a PCB, a leadframe or a TAB tape. The number of die may vary in alternative embodiments and may for example be a flash memory array (e.g., NOR, NAND or other), S-RAM or DDT, and/or a controller chip such as an ASIC. Other semiconductor die are contemplated. Solder balls 158 (seen in phantom in FIG. 12 and shown in FIG. 13) are provided for physically and electrically coupling BGA package 156 to PCB 104. Solder balls 158 may be melted to permanently affix BGA package 156 to PCB 104 in a known reflow process.

Figure 13:
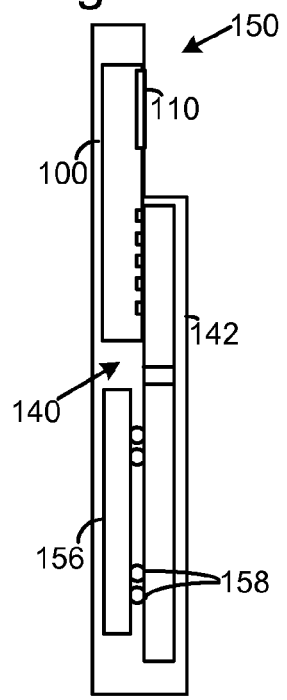
FIG. 13 is a side view of the hybrid multi die assembly of FIG. 12 mounted within a standard SD lid.

FIG. 13 is a side view showing the multi-die assembly 140 including SiP package 100, BGA package 156 and PCB 104 enclosed within a standard lid 142 to form a completed portable memory card 150. Again, lid 142 may be a standard lid used for SD memory cards. While a specific configuration of a BGA package 156 is shown, it will be appreciated that any of a variety of BGA package configurations may be mounted to PCB 104 in alternative embodiments.

Figure 14:
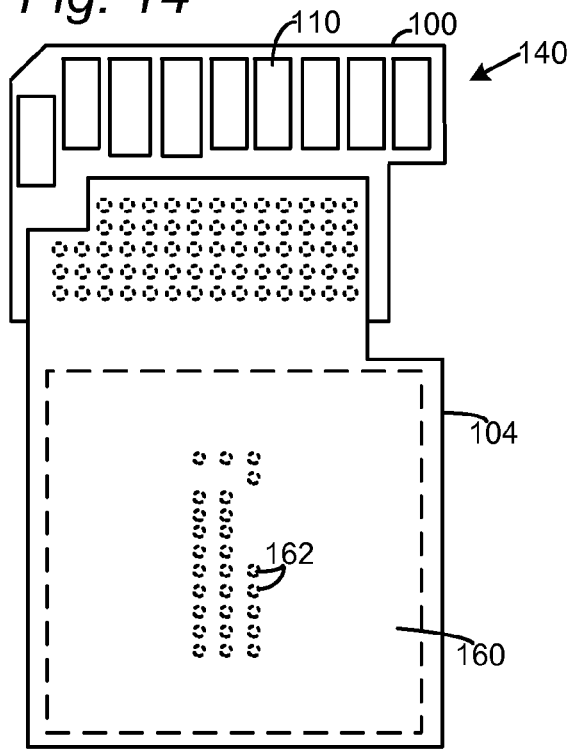
FIG. 14 is a bottom view of a hybrid multi-die assembly according to a further embodiment of the present invention.

A further embodiment of a multi-die assembly 140 is shown in FIG. 14. In the embodiment of FIG. 14, multi-die assembly 140 includes a SiP LGA package 100 mounted to PCB 104 as described above, and further including a second LGA package 160 mounted to PCB 104. LGA package 160 may be fabricated for a specific use with PCB 104 and may be fabricated without contact fingers. LGA package 160 may include contact pads 162 for physically and electrically coupling LGA package 160 to PCB 104 using solder balls in a known reflow process. While a specific configuration of a LGA package 160 is shown, it will be appreciated that any of a variety of LGA package configurations may be mounted to PCB 104 in alternative embodiments.

Figure 15:
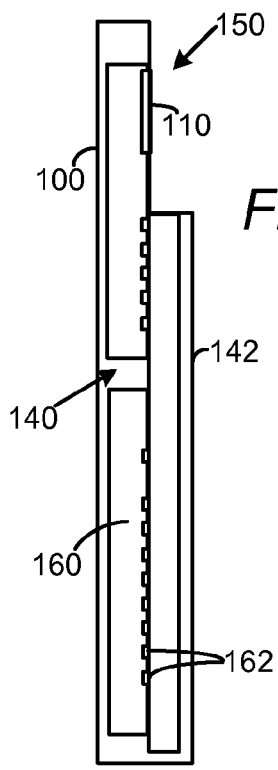
FIG. 15 is a side view of the hybrid multi-die assembly of FIG. 14 mounted within a standard SD lid.

FIG. 15 is a side view of the multi-die assembly 140 shown in FIG. 14 encased within a lid 142. As described above, lid 142 may be a standard portable memory lid, such as for example an SD lid.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of forming a portable memory of standard size, comprising the steps of:
    (a) electrically coupling a land grid array memory package to a printed circuit board;
    (b) electrically coupling a second semiconductor memory package to the printed circuit board;
    (c) configuring the printed circuit board with a reduced diameter midsection between a first section supporting the land grid array package and a second section supporting the second semiconductor package, the reduced diameter midsection being narrower than the first and second sections to allow relative movement between the first and second sections; and
    (d) enclosing the land grid array memory package, the printed circuit board and the second semiconductor memory package in a standard size portable memory lid.

2. A method as recited in claim 1, wherein said step (b) of electrically coupling a second semiconductor package to the printed circuit board comprises the step of electrically coupling a surface mounted package to the printed circuit board.

3. A method as recited in claim 2, wherein said step (b) of electrically coupling a surface mounted package to the printed circuit board comprises the step of electrically coupling a TSOP package to the printed circuit board.

4. A method as recited in claim 1, wherein said step (b) of electrically coupling a second semiconductor package to the printed circuit board comprises the step of electrically coupling a ball grid array package to the printed circuit board.

5. A method as recited in claim 1, wherein said step (b) of electrically coupling a second semiconductor package to the printed circuit board comprises the step of electrically coupling a second land grid array package to the printed circuit board.

6. A method as recited in claim 1, wherein said step (d) of enclosing the land grid array package, the printed circuit board and the second semiconductor package in a standard size portable memory lid comprises the step of enclosing the land grid array package, the printed circuit board and the second semiconductor package in a standard secure digital portable memory lid.

* * * * *